(12) United States Patent
Sawada

(10) Patent No.: US 12,027,743 B2
(45) Date of Patent: Jul. 2, 2024

(54) TRANSMISSION APPARATUS, PRINTED CIRCUIT BOARD, AND INFORMATION APPLIANCE

(71) Applicant: SONY SEMICONDUCTOR SOLUTIONS CORPORATION, Kanagawa (JP)

(72) Inventor: Kazuya Sawada, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 365 days.

(21) Appl. No.: 17/309,427

(22) PCT Filed: Sep. 5, 2019

(86) PCT No.: PCT/JP2019/035066
§ 371 (c)(1),
(2) Date: May 26, 2021

(87) PCT Pub. No.: WO2020/115978
PCT Pub. Date: Jun. 11, 2020

(65) Prior Publication Data
US 2022/0294095 A1 Sep. 15, 2022

(30) Foreign Application Priority Data
Dec. 6, 2018 (JP) ................. 2018-228868

(51) Int. Cl.
*H05K 1/02* (2006.01)
*H01P 3/08* (2006.01)
(Continued)

(52) U.S. Cl.
CPC ............. *H01P 3/08* (2013.01); *H05K 1/0237* (2013.01); *H05K 1/11* (2013.01)

(58) Field of Classification Search
CPC ...... H05K 1/02; H05K 1/0228; H05K 1/0237; H05K 1/0239; H05K 1/024; H05K 1/11;
(Continued)

(56) References Cited

U.S. PATENT DOCUMENTS 3,843,863 A * 10/1974 Fitzmayer ................. H01P 5/04
219/745
5,049,892 A * 9/1991 Lindenmeier ........ H01Q 1/1271
343/862
(Continued)

FOREIGN PATENT DOCUMENTS

CN 102195112 A 9/2011
CN 103563071 A 2/2014
(Continued)

OTHER PUBLICATIONS

International Search Report and Written Opinion of PCT Application No. PCT/JP2019/035066, dated Nov. 26, 2019, 09 pages of ISRWO.

*Primary Examiner* — Xiaoliang Chen
(74) *Attorney, Agent, or Firm* — CHIP LAW GROUP

(57) ABSTRACT

There is provided a transmission apparatus having a transmission line into which a low-impedance part is inserted. The transmission apparatus includes a package having a first impedance, a first transmission line and a second transmission line respectively connected on either side of the package and having a second impedance different from the first impedance, and an intermediate section respectively disposed in a connection between the package and the first transmission line and in a connection between the package and the second transmission line. The intermediate section is adjusted to have an electrical length of λ/4 (where λ is an electromagnetic wavelength corresponding to a desired fre-
(Continued)

quency) and an impedance that is intermediate between the first impedance and the second impedance.

7 Claims, 6 Drawing Sheets

(51) Int. Cl.
| | | |
|---|---|---|
| *H01P 5/02* | (2006.01) | |
| *H01P 5/04* | (2006.01) | |
| *H01P 5/16* | (2006.01) | |
| *H03F 1/56* | (2006.01) | |
| *H03F 3/195* | (2006.01) | |
| *H03F 3/21* | (2006.01) | |
| *H03F 3/213* | (2006.01) | |
| *H03F 3/60* | (2006.01) | |
| *H05K 1/11* | (2006.01) | |

(58) Field of Classification Search
CPC ... H05K 1/165; H01P 3/08; H01P 5/02; H01P 5/04; H01P 5/028; H01P 5/16; H01L 2924/00; H01L 2924/00014; H01L 2924/01078; H01L 2924/1903; H01L 2924/19051; H01L 2924/3011; H01L 2924/30107; H01L 2924/4911; H01L 2924/48091; H01L 2924/48227; G01R 1/0408; H03F 1/56; H03F 1/0288; H03F 1/3205; H03F 3/21; H03F 3/60; H03F 3/195; H03F 3/211; H03F 3/213; H03F 3/245
USPC .......... 361/784; 330/67, 149, 307; 333/17.3, 333/35, 127, 128, 238
See application file for complete search history.

(56) References Cited

U.S. PATENT DOCUMENTS

| | | | | |
|---|---|---|---|---|
| 5,563,558 | A * | 10/1996 | Mohwinkel | H01P 5/16 333/127 |
| 7,911,271 | B1 * | 3/2011 | Jia | H03F 3/60 330/307 |
| 10,591,511 | B1 * | 3/2020 | Tsironis | G01R 1/0408 |
| 2002/0024403 | A1 * | 2/2002 | du Toit | H03F 3/60 333/33 |
| 2004/0000963 | A1 * | 1/2004 | Killen | H01P 5/02 333/35 |
| 2009/0174476 | A1 * | 7/2009 | Komatsu | H03F 3/245 330/149 |
| 2011/0050369 | A1 * | 3/2011 | Ma | H01P 5/028 333/238 |
| 2011/0204993 | A1 | 8/2011 | Masuda | |
| 2012/0119844 | A1 * | 5/2012 | Du Toit | H01P 5/04 333/17.3 |
| 2014/0091885 | A1 | 4/2014 | Shiozaki et al. | |
| 2014/0300003 | A1 | 10/2014 | Kariyazaki et al. | |
| 2015/0123258 | A1 | 5/2015 | Kariyazaki et al. | |
| 2017/0302245 | A1 * | 10/2017 | Sadler | H03H 7/383 |
| 2018/0091100 | A1 * | 3/2018 | Wey | H03F 1/0288 |
| 2018/0167042 | A1 * | 6/2018 | Nagasaku | H04B 1/0475 |

FOREIGN PATENT DOCUMENTS

| | | |
|---|---|---|
| CN | 104103627 A | 10/2014 |
| EP | 2360775 A2 | 8/2011 |
| JP | 2003-174244 A | 6/2003 |
| JP | 2003-273611 A | 9/2003 |
| JP | 2005-079762 A | 3/2005 |
| JP | 2011-172072 A | 9/2011 |
| JP | 2011-172173 A | 9/2011 |
| JP | 2014-204057 A | 10/2014 |
| JP | 2016-072818 A | 5/2016 |
| JP | 2017-038133 A | 2/2017 |
| TW | 201315316 A | 4/2013 |
| WO | 2013/027409 A1 | 2/2013 |

* cited by examiner

TRANSMISSION APPARATUS, PRINTED CIRCUIT BOARD, AND INFORMATION APPLIANCE

CROSS REFERENCE TO RELATED APPLICATIONS

This application is a U.S. National Phase of International Patent Application No. PCT/JP2019/035066 filed on Sep. 5, 2019, which claims priority benefit of Japanese Patent Application No. JP 2018-228868 filed in the Japan Patent Office on Dec. 6, 2018. Each of the above-referenced applications is hereby incorporated herein by reference in its entirety.

TECHNICAL FIELD

The technology disclosed in this specification relates to a transmission apparatus, a printed circuit board, and an information appliance having a transmission line into which a low-impedance part is inserted.

BACKGROUND ART

It is known that the presence of mismatched impedance on a transmission line causes reflections and degradation in the propagation characteristics. For example, in an apparatus that handles high-frequency signals such as millimeter waves, large reflections occur, and therefore the above problem becomes more apparent.

For example, for a circuit board on which a semiconductor chip is mounted, a semiconductor apparatus and a circuit board have been proposed in which impedance matching is achieved by disposing a through-hole with a large via land at a location distanced by $\lambda/4$ the electrical length (where $\lambda$ is the electromagnetic wavelength corresponding to a desired frequency) from an electrode (land) electrically connected to the semiconductor chip (see Patent Literature 1). However, as the frequency of the transmission signal goes higher, the wavelength $\lambda$ shortens and the distance between the land and the via hole becomes shorter, and consequently there are concerns about the increased difficulty of the circuit board manufacturing.

Also, for a multilayer circuit board in which a micro strip line and a stripline are connected by a through-hole, a circuit board has been proposed in which an impedance matching part of increased width is formed in a portion $\lambda/4$ away from the stripline through-hole (see Patent Literature 2). According to the circuit board, reflections at the reflections produced at the difference in width have opposite phase with respect to reflections produced at the through-hole, and a cancellation of the reflections is anticipated. However, it is necessary to mount the line immediately before the structure that causes reflections.

Also proposed is a transmission apparatus provided with two transmission lines respectively connected to an upstream side and a downstream side of an impedance mismatch section of a transmission line and having the same delay time as the impedance mismatch section, and a plurality of transmission lines connected to the two transmission lines having the same delay time as the impedance mismatch section, the plurality of transmission lines having delay time factors of 2×n (where n is a positive integer) with respect to the delay time of the transmission lines having the same delay time as the impedance mismatch section, and also connected nearer to the impedance mismatch section for smaller values of n, in which the characteristic impedance of each of the transmission lines is set such that the reflection coefficients of connections between each of the transmission lines are equal (see Patent Literature 3).

CITATION LIST

Patent Document

Patent Document 1: Japanese Patent Application Laid-Open No. 2014-204057
Patent Document 2: Japanese Patent Application Laid-Open No. 2016-72818
Patent Document 3: Japanese Patent Application Laid-Open No. 2017-38133

SUMMARY OF THE INVENTION

Problems to be Solved by the Invention

An object of the technology disclosed in this specification is to provide a transmission apparatus, a printed circuit board, and an information appliance that have a transmission line into which a low-impedance part is inserted and suppress propagation loss due to mismatched impedance.

Solutions to Problems

A first aspect of the technology disclosed in the present specification is
a transmission apparatus including:
a package having a first impedance;
a first transmission line and a second transmission line respectively connected on either side of the package and having a second impedance different from the first impedance; and
an intermediate section respectively disposed in a connection between the package and the first transmission line and in a connection between the package and the second transmission line, and adjusted to have an electrical length of $\lambda/4$ (where $\lambda$ is an electromagnetic wavelength corresponding to a desired frequency) and an impedance that is intermediate between the first impedance and the second impedance.

For example, the package is a circuit chip, the first transmission line and the second transmission line are wiring patterns formed on a printed circuit board, terminals on both ends of the circuit chip are respectively soldered to a land formed at each end of the first transmission line and the second transmission line, and the intermediate section is a resist film application region that covers the land and an area near the land of the first transmission line and the second transmission line. Then, the impedance of the intermediate section is adjusted on the basis of a size of the land. In addition, the resist film application region is formed from an electrical contact between a terminal of the circuit chip and the wiring pattern up to a point at which an electrical length of $\lambda/4$ is reached.

In addition, a second aspect of the technology disclosed in the present specification is
a printed circuit board having a surface on which a circuit chip having a first impedance is mounted,
the printed circuit board including:
a first wiring pattern and a second wiring pattern respectively connected to an input terminal and an output terminal of the circuit chip and having a second impedance different from the first impedance;

a first land configured to act as a contact between the input terminal of the circuit chip and the first wiring pattern and a second land configured to act as a contact between the output terminal of the circuit chip and the second wiring pattern, the first and second lands each having a third impedance that is intermediate between the first impedance and the second impedance; and a resist film application region that covers the first land and the second land, and has an electrical length corresponding to a desired frequency.

In addition, a third aspect of the technology disclosed in the present specification is an information appliance including:

one or a plurality of printed circuit boards, at least one printed circuit board having a surface on which a circuit chip having a first impedance is mounted;

a first wiring pattern and a second wiring pattern respectively connected to an input terminal and an output terminal of the circuit chip and having a second impedance different from the first impedance;

a first land configured to act as a contact between the input terminal of the circuit chip and the first wiring pattern and a second land configured to act as a contact between the output terminal of the circuit chip and the second wiring pattern, the first and second lands each having a third impedance that is intermediate between the first impedance and the second impedance; and a resist film application region that covers the first land and the second land, and has an electrical length corresponding to a desired frequency.

Effects of the Invention

According to the technology disclosed in this specification, a transmission apparatus, a printed circuit board, and an information appliance that have a transmission line into which a low-impedance part is inserted, such as a printed circuit board on which a circuit chip is mounted, and suppress propagation loss due to mismatched impedance can be provided.

Note that the advantageous effects described in this specification are merely for the sake of example, and the advantageous effects of the present invention are not limited thereto. Furthermore, in some cases the present invention may also exhibit additional advantageous effects other than the advantageous effects given above.

Further objectives, features, and advantages of the technology disclosed in this specification will be clarified by a more detailed description based on the exemplary embodiments described hereinafter and the attached drawings.

MODE FOR CARRYING OUT THE INVENTION

Hereinafter, an embodiment of the technology disclosed in this specification will be described in detail with reference to the drawings.

Figure 1:
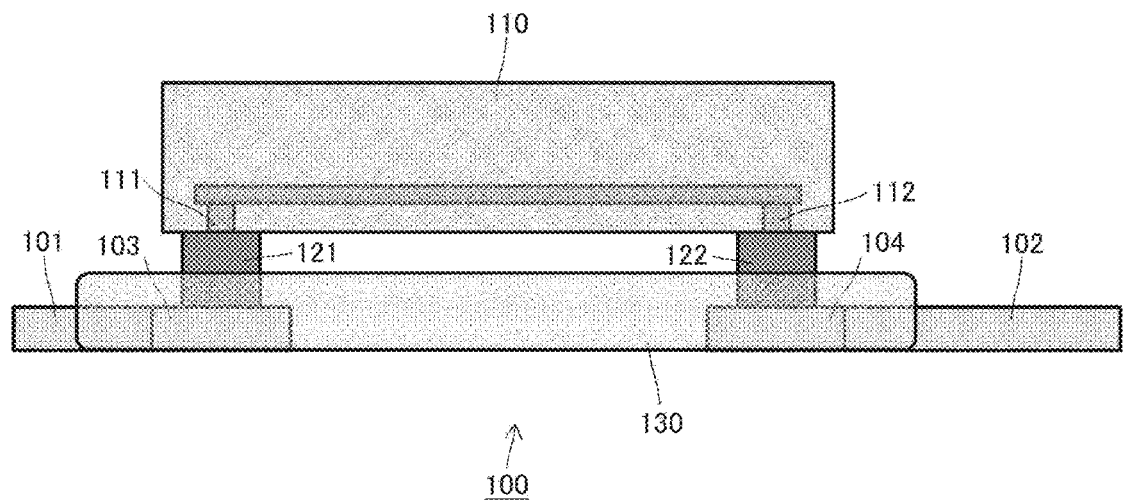
FIG. 1 is a diagram (side view) illustrating an exemplary configuration of a printed circuit board 100.
Figure 2:
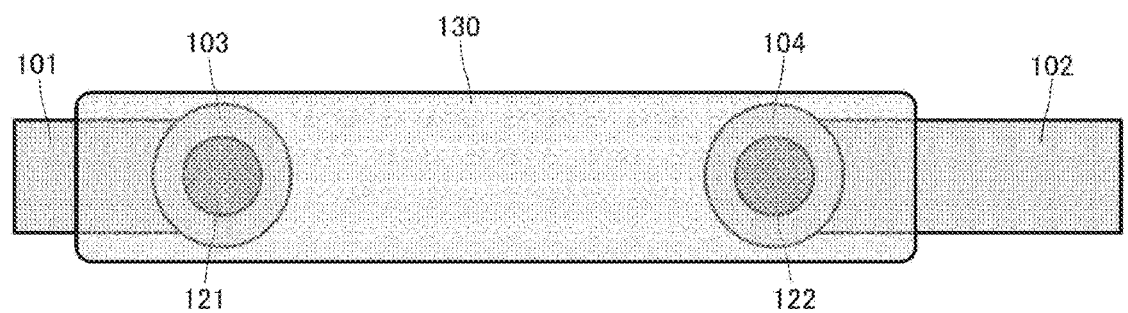
FIG. 2 is a diagram (top view) illustrating an exemplary configuration of the printed circuit board 100.

FIGS. 1 and 2 illustrate an exemplary configuration of a printed circuit board 100 envisioned in the present embodiment. However, FIG. 1 illustrates a view seen from the side of the printed circuit board 100 with a circuit chip 110 mounted thereon, while FIG. 2 illustrates a view seen from the top of the printed circuit board 100 (and with the circuit chip 110 removed).

The circuit chip 110 is mounted onto the printed circuit board 100. The circuit chip 110 is an electronic component also referred to as a "package". Here, a high-frequency circuit that handles signals such as millimeter-wave signals for high-speed wireless communication for example is anticipated as the circuit chip 110.

Interconnects 101 and 102 containing copper foil or the like are formed by lithographic technology on the top face of the printed circuit board 100. Additionally, the interconnect 101 has a land 103 on the end, and the interconnect 102 has a land 104 on the end.

Connecting terminals 111 and 112 of the circuit chip 110 are electrically connected to the land 103 on the end of the interconnect 101 and to the land 104 on the end of the interconnect 102 by solder 121 and 122, respectively.

In addition, a predetermined region on the surface of the printed circuit board 100 is covered by a resist film 130. The resist film 130 acts to insulate or prevent shorts between the interconnects, and also prevent oxidation of the interconnects and the like.

Note that for simplicity, FIGS. 1 and 2 illustrate a configuration in which only the two interconnects 101 and 102 are formed collinearly on the surface of the printed circuit board 100, and in addition, the circuit chip 110 has one connecting terminal each on the left and right sides of the page and is electrically connected between the interconnects 101 and 102. Actually, however, it is anticipated that many interconnects would be formed complexly on the surface of the printed circuit board 100, and that the circuit chip 110 would have many terminals. In addition, the printed circuit board 100 may also be a multilayer substrate.

Figure 3:
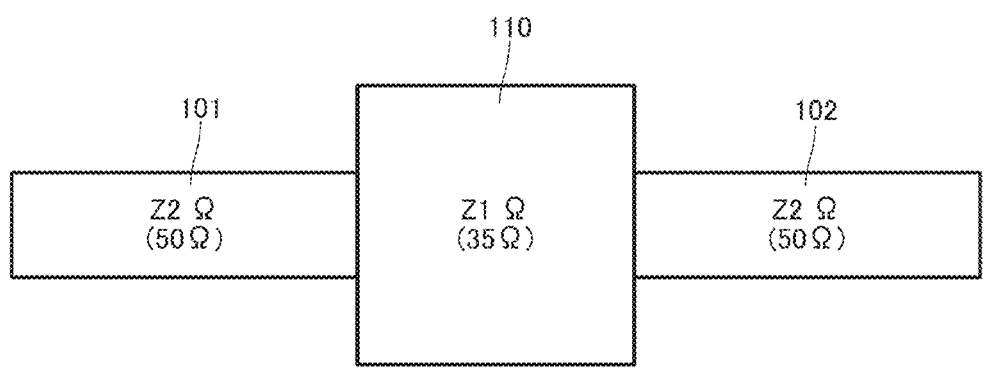
FIG. 3 is a diagram schematically illustrating an impedance configuration of the printed circuit board 100 on which a circuit chip 110 is mounted.

FIG. 3 schematically illustrates an impedance configuration of the printed circuit board 100 on which the circuit chip 110 is mounted as illustrated in FIG. 1. Generally, the interconnects 101 and 102 formed on the surface of the printed circuit board 100 are produced by adjusting the impedance to be 50 ohms. Meanwhile, if the circuit chip 110 is also produced by adjusting the impedance to be 50 ohms, the impedance will be matched with the printed circuit board 100. However, in reality, the circuit chip 110 may be produced as an electronic component having a low impedance of approximately 35 ohms, for example. As a result, the portion of mismatched impedance between the circuit chip 110 and the interconnects 101 and 102 connected on either side causes reflections, and the problem of degraded propagation characteristics occurs.

Figure 4:
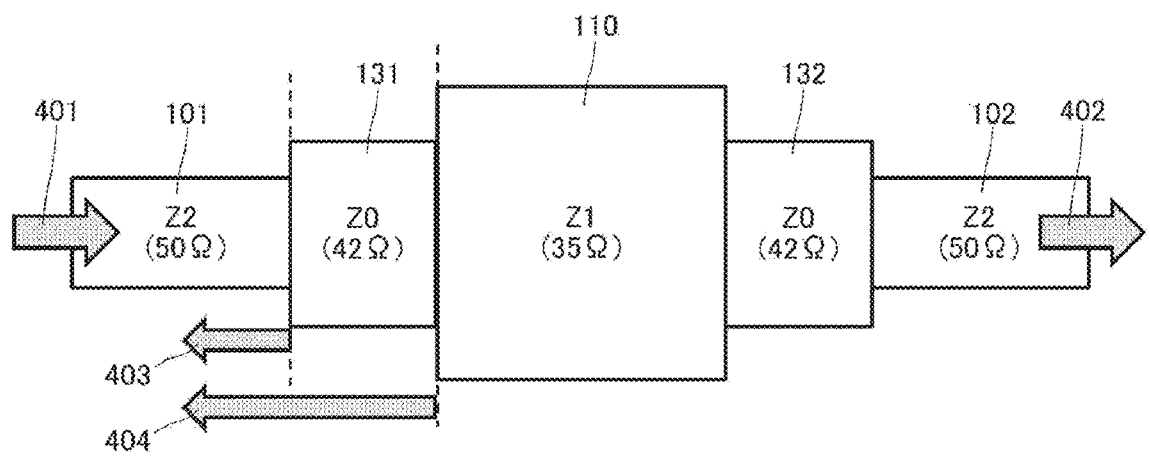
FIG. 4 is a diagram schematically illustrating an impedance configuration (example of improvement) of the printed circuit board 100 on which a circuit chip 110 is mounted.

Accordingly, in this specification, an impedance configuration is proposed in which impedance-adjusted intermediate sections 131 and 132 having an electrical length of λ/4 (where λ is the electromagnetic wavelength corresponding to a desired frequency) are disposed respectively between the low-impedance circuit chip 110 and the interconnects 101 and 102 acting as transmission lines connected on either side, as illustrated in FIG. 4.

A signal input into one interconnect 101, as indicated by the reference number 401, passes through the intermediate section 131, the circuit chip 110, and the intermediate section 132, and is output from the other interconnect 102, as indicated by the reference number 402, and during this process, a reflected wave reflected at the boundary between the interconnect 101 and the intermediate section 131 and a reflected wave reflected at the boundary between the intermediate section 131 and the circuit chip 110 are produced, as indicated by the reference numbers 403 and 404.

By causing the intermediate section 131 to have an electrical length of λ/4, the reflected wave 403 and the reflected wave 404 of the desired frequency can be set to opposite phase and the same power, and by causing the reflected wave 403 and the reflected wave 404 to cancel out, mismatched impedance at the desired frequency can be resolved and propagation loss can be suppressed. Also, in the case where a signal input into the interconnect 102 is output from the interconnect 101, reflected waves having opposite phase and the same power are canceled out similarly, and propagation loss due to mismatched impedance can be suppressed.

Provided that the impedance of the low-impedance circuit chip 110 is Z1 (for example, Z1=35 ohms) and the impedance of the interconnects 101 and 102 acting as transmission lines is Z2 (for example, Z2=50 ohms), an impedance Z0 of each of the intermediate sections 131 and 132 is an intermediate impedance between Z1 and Z2 (that is, Z2<Z0<Z1).

More preferably, the impedance Z0 of each of the intermediate sections 131 and 132 is expressed by the following Expression (1) or is approximated by the value expressed in the following Expression (1).

[Math. 1]

$$Z0=\sqrt{Z1\times Z2} \tag{1}$$

Provided that the impedance value Z1 of the circuit chip 110 is 35 ohms and the impedance value Z2 of the interconnects 101 and 102 is 50 ohms, the appropriate impedance value Z0 of each of the intermediate sections 131 and 132 is calculated to be approximately 42 ohms according to Expression (1) above.

One possible method of impedance matching is to dispose a capacitive and inductive structure of appropriate size and appropriate length immediately before the structural portion where signals are reflected.

On the printed circuit board 100 as illustrated in FIGS. 1 and 2, a capacitive and inductive structure can be disposed immediately before the structural portion where signals are reflected by increasing the size (land diameter) of the lands 103 and 104 that act as the electrical contacts between the circuit chip 110 having low impedance and the interconnects 101 and 102 having high impedance, or with the application region of the resist film 130. In other words, the intermediate sections 131 and 132 having the desired impedance value and electrical length can be achieved by the land 103 of appropriate size and the 104 of appropriate electrical length and by the resist film 130.

Specifically, the impedance Z0 of the intermediate sections 131 and 132 on either side of the circuit chip 110 can be adjusted by the size (land diameter) of the lands 103 and 104 that are the electrical contact portions between the terminals of the circuit chip 110 and each of the interconnects 101 and 102. The size of the lands 103 and 104 for which an optimal impedance value Z0 as expressed in Expression (1) above is obtained can be acquired through simulation, for example.

Figure 5:
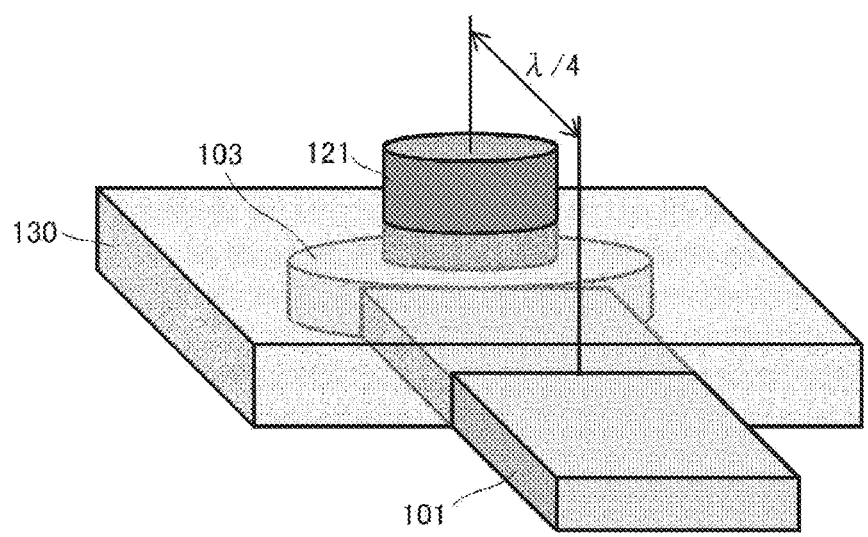
FIG. 5 is a diagram illustrating an impedance matching structure of the printed circuit board 100.

Also, as described earlier, the intermediate sections 131 and 132 that adjust the impedance desirably have an electrical length of λ/4 (where λ is the electromagnetic wavelength corresponding to a desired frequency). In the printed circuit board 100 as illustrated in FIGS. 1 and 2, the intermediate sections 131 and 132 correspond to the application region of the resist film 130 formed so as to cover the area near the lands 103 and 104. Consequently, as illustrated in FIG. 5, by forming the intermediate section 131 on the interconnect 101 by the application region of the resist film 130 from the electrical contact between a terminal of the circuit chip 110 and the interconnect 101 up to the point at which an electrical length of λ/4 is reached, propagation loss due to reflections of signals at the desired frequency can be suppressed. Also, although omitted from illustration, the intermediate section 132 is formed by the application region of the resist film 130 on the interconnect 102.

Figure 6:
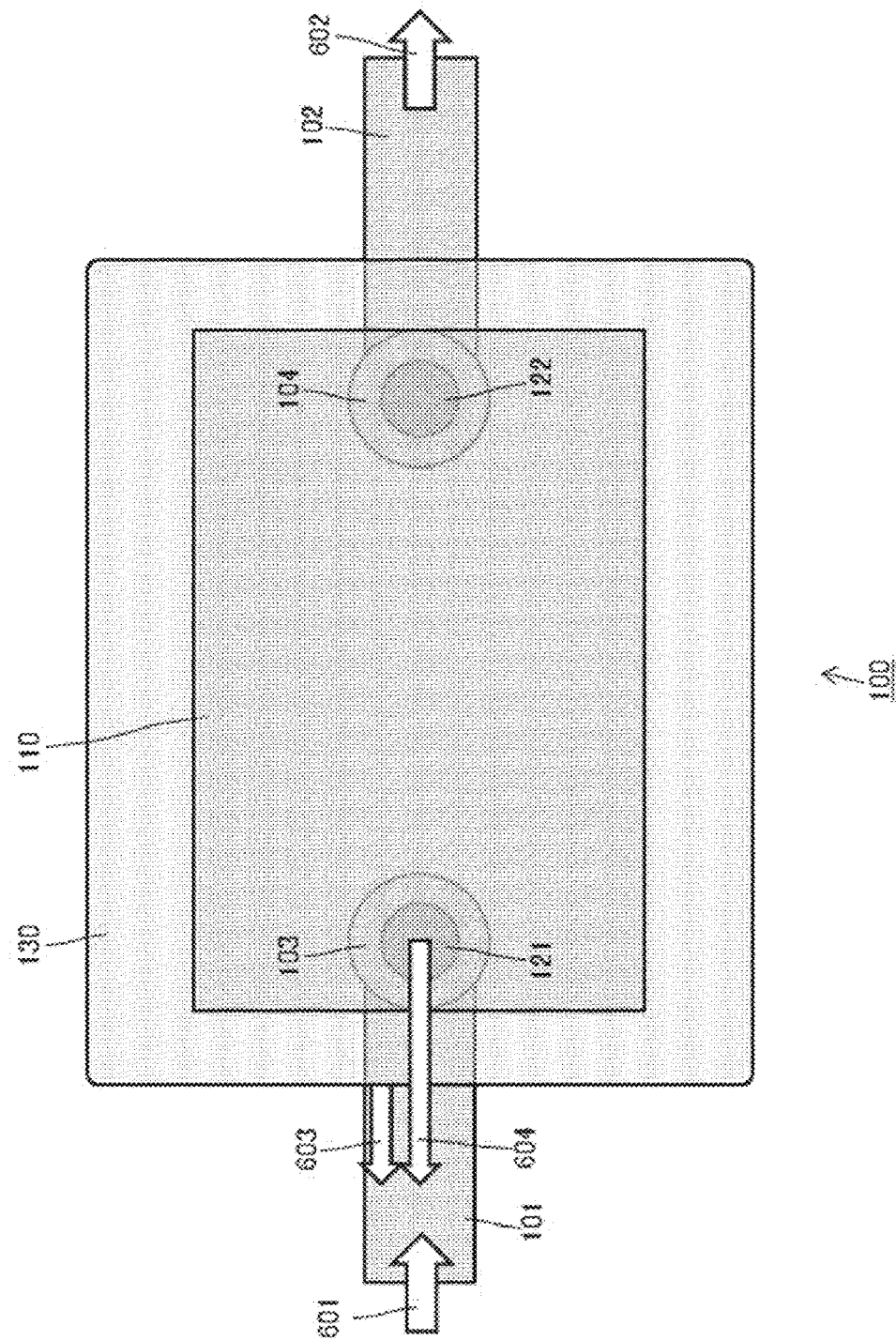
FIG. 6 is a diagram illustrating how a signal is transmitted on the printed circuit board 100.

FIG. 6 schematically illustrates how a signal is transmitted on the printed circuit board 100. At this point, suppose that a signal is input into one interconnect 101, as indicated by the reference number 601, and is output from the other interconnect 102, as indicated by the reference number 602.

As the input signal 601 passes through the intermediate section 131, the circuit chip 110, and the intermediate section 132, a reflected wave reflected at the boundary between the interconnect 101 and the intermediate section 131 is produced, as indicated by the reference number 603, and additionally, a reflected wave reflected at the boundary between the intermediate section 131 and the circuit chip 110 is produced, as indicated by the reference number 604. Note that in FIG. 6, the intermediate section 131 is the application region of the resist film 130 on the interconnect 101, while the intermediate section 132 is the application region of the resist film 130 on the interconnect 102.

By causing the intermediate section 131 containing the application region of the resist film 130 to have an electrical length of λ/4, the reflected wave 603 and the reflected wave 404 of the desired frequency can be set to opposite phase and the same power, and by causing the reflected wave 603 and the reflected wave 604 to cancel out, mismatched impedance at the desired frequency can be resolved and propagation loss can be suppressed.

Also, in the case where a signal input into the interconnect 102 is output from the interconnect 101, reflected waves having opposite phase and the same power are canceled out similarly, and propagation loss due to mismatched impedance can be suppressed.

Figure 7:
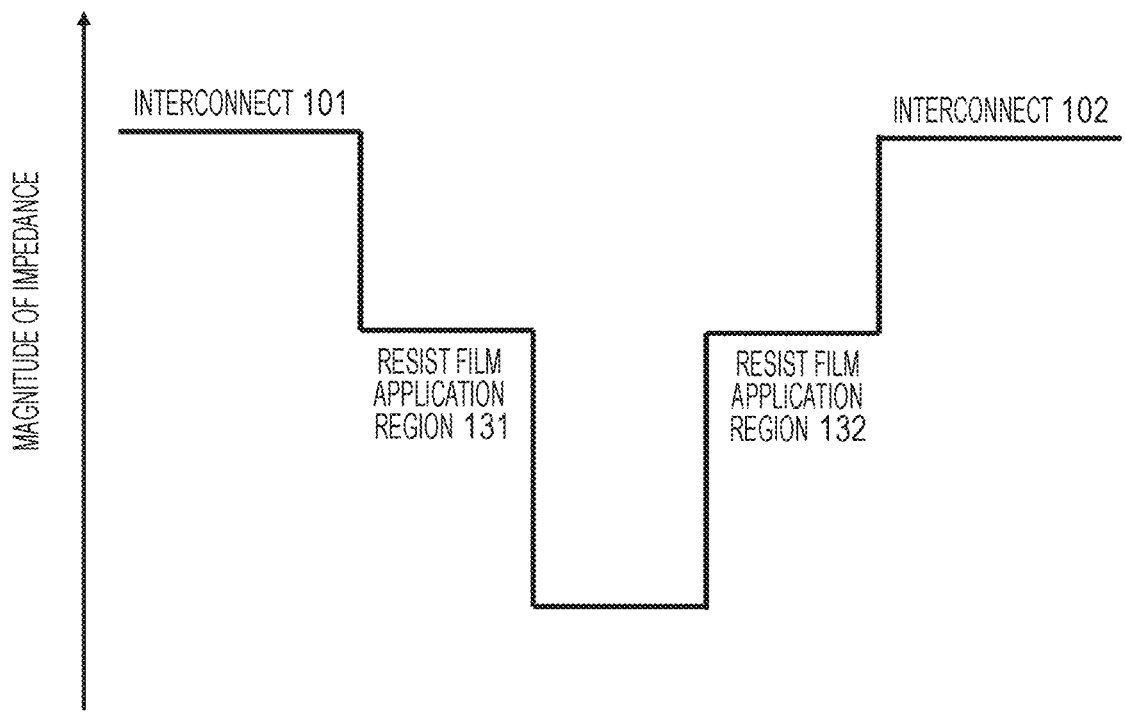
FIG. 7 is a diagram illustrating an impedance distribution when a land diameter and a resist film application region are enlarged.

FIG. 7 illustrates an impedance distribution in the signal transmission direction of the printed circuit board 100 when the land diameter of the lands 103 and 104 is enlarged and the application region of the resist film 130 is also enlarged to an electrical length of λ/4. On either side of the low-impedance (for example, 35 ohms) circuit chip 110, application regions 131 and 132 of the resist film 130 having an intermediate impedance (for example, 42 ohms) are formed between the circuit chip 110 and the high-impedance (for example, 50 ohms) interconnects 101 and 102. As described above, when a signal is input from the end of the interconnect 101, the reflections produced between the interconnect 101 and the resist film application region 131 and the reflections produced between the resist film application region 131 and the circuit chip 110 have the same magnitude (power) and opposite phase, and therefore cancel each other out completely.

Also, when a signal is input from the end of the interconnect 102, the reflections produced between the interconnect 102 and the resist film application region 132 and the reflections produced between the resist film application region 132 and the circuit chip 110 have the same magnitude (power) and opposite phase, and therefore cancel each other out completely.

Figure 8:
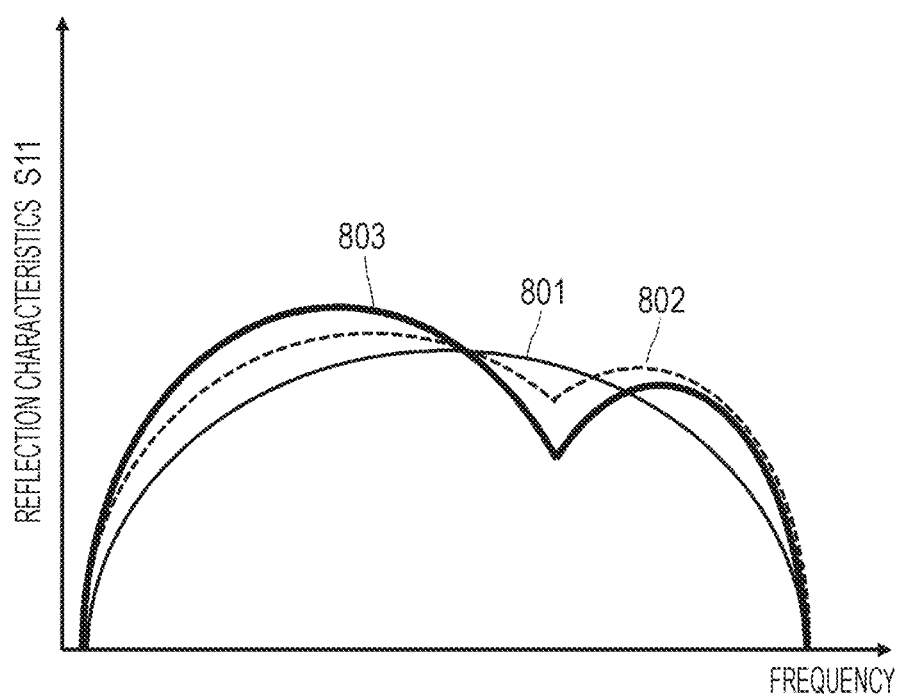
FIG. 8 is a graph illustrating reflection characteristics S11 according to frequency of the printed circuit board 100.

Additionally, FIG. 8 illustrates reflection characteristics S11 according to frequency of the printed circuit board 100. In the graph, the reference number 801 denotes the reflection characteristics S11 of the printed circuit board 100 before improving the land diameter of the lands 103 and 104 and the application region of the resist film 130, and the reference number 802 denotes the reflection characteristics of the printed circuit board 100 after improving the land diameter of the lands 103 and 104 and the application region of the resist film 130. Also, the reference number 803 denotes the reflection characteristics S11 of the printed circuit board 100 when the land diameter of the lands 103 and 104 is optimized to obtain an optimal impedance value and the application region of the resist film 130 is also optimized to obtain an electrical length of λ/4. The reflection characteristics S11 denoted by the reference number 803 demonstrate that reflections in a predetermined band are successfully suppressed to a large degree.

By improving and further optimizing the land diameter of the lands 103 and 104 and the electrical length of the application region of the resist film 130, reflections produced between the interconnect 101 and the resist film application region 131 and reflections produced between the resist film application region 131 and the circuit chip 110 approach the same magnitude and also approach opposite phase. Consequently, as FIG. 8 demonstrates, reflection characteristics with suppressed reflections at the desired frequency are obtained, or in other words, propagation loss due to the reflection of signals at the desired frequency can be reduced.

Figure 9:
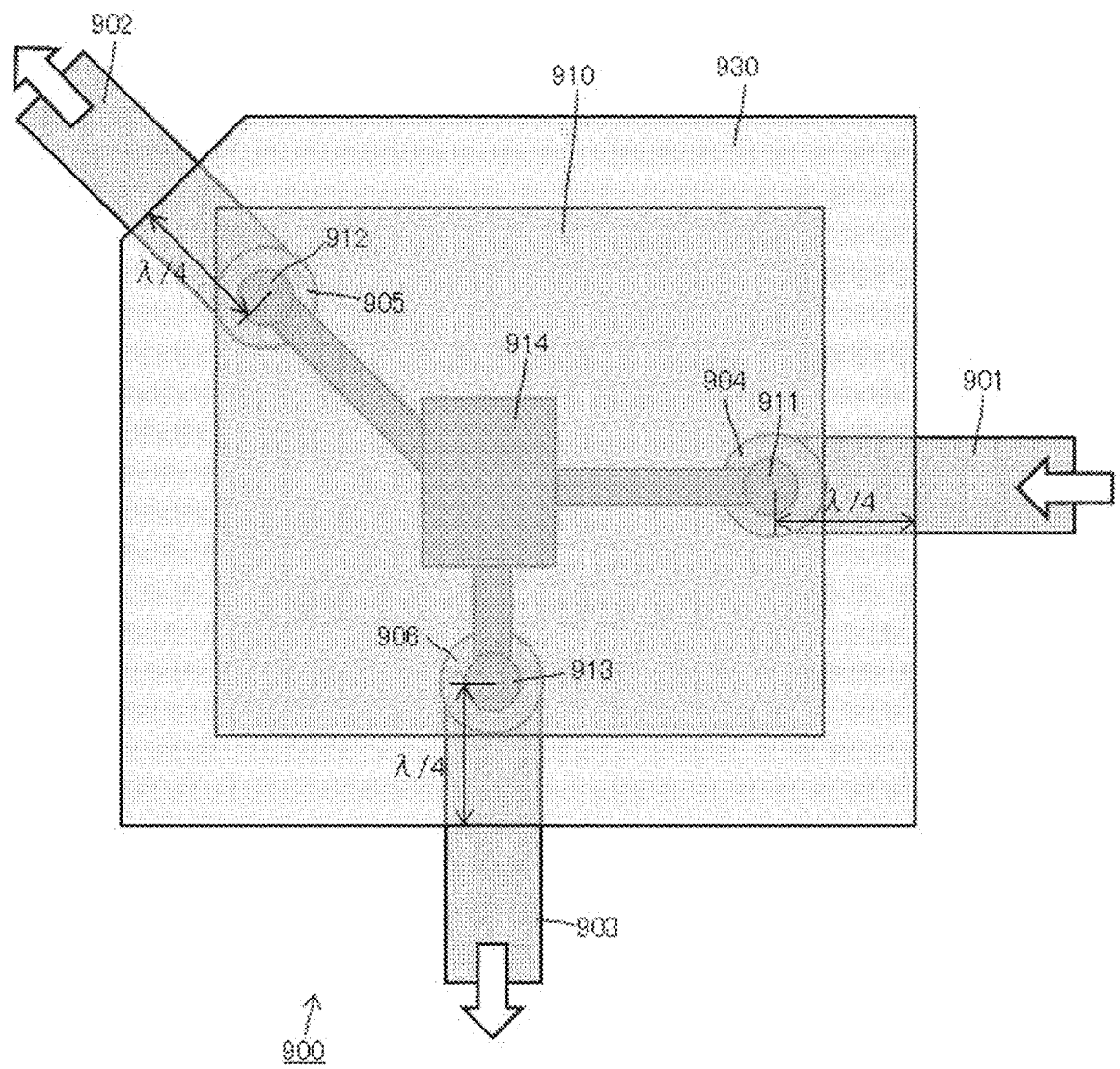
FIG. 9 is a diagram illustrating an exemplary configuration of a printed circuit board 900 according to a modification.

FIG. 9 illustrates an exemplary configuration of a printed circuit board 900 according to a modification in which the land diameter and the electrical length of the resist film are optimized.

A circuit chip 910 mounted on the printed circuit board 900 includes one input terminal 911, two output terminals 912 and 912, and a radio frequency (RF) switch 914 that selects one of the output terminals 912 or 913 as the output destination of a signal input into the input terminal 911.

Also, on the surface of the printed circuit board 900, an interconnect 901 for transmitting an input signal to the input terminal 911, a land 904 formed on the leading end of the interconnect 901 to act as an electrical contact with the input terminal 911, an interconnect 902 for transmitting a signal output from the output terminal 912, a land 905 formed on the leading end of the interconnect 902 to act as an electrical contact with the output terminal 912, an interconnect 903 for transmitting a signal output from the output terminal 913, and a land 906 formed on the leading end of the interconnect 903 to act as an electrical contact with the output terminal 913 are formed. Each electrical contact between a terminal and an interconnect is bonded by solder, but is omitted from illustration herein.

Furthermore, a predetermined region on the surface of the printed circuit board 900 is covered by a resist film 930. The resist film 930 acts to insulate or prevent shorts between the interconnects, and also prevent oxidation of the interconnects and the like. In the present embodiment, the application region of the resist film 930 also acts to impart capacitance immediately before a structural portion where signals are reflected.

The circuit chip 910 has a low impedance Z1, whereas the interconnects 911, 912, and 913 have a high impedance Z2. Also, by imparting capacitance, the application region of the resist film 130 acts as an intermediate section having an intermediate impedance Z0 (where Z1<Z0<Z2).

The value of the impedance Z0 of the intermediate section is calculated from the low impedance value Z1 and the high impedance value Z2 using Expression (1) above. The impedance of the intermediate sections at the electrical contacts of each of the terminals 911 to 913 can be adjusted according to the land diameter of each of the lands 904 to 906.

Also, to suppress propagation loss due to reflections of signals transmitted through each of the interconnects 901 to 903, it is desirable for the distances from the center of each of the terminals 911 to 913 to the edge of the resist film 930 that act as the intermediate sections to each have an electrical length of λ/4 (where λ is the electromagnetic wavelength corresponding to a desired frequency). To make the distance from the center of the terminal 912 to the edge of the resist film 930 have an electrical length of λ/4, the shape of the resist film 903 of the interconnect 912 having a signal transmission line in an oblique direction is a shape with the corner of the resist film 930 cut off so that the edge is perpendicular to the longitudinal direction of the line of the interconnect 902.

Figure 10:
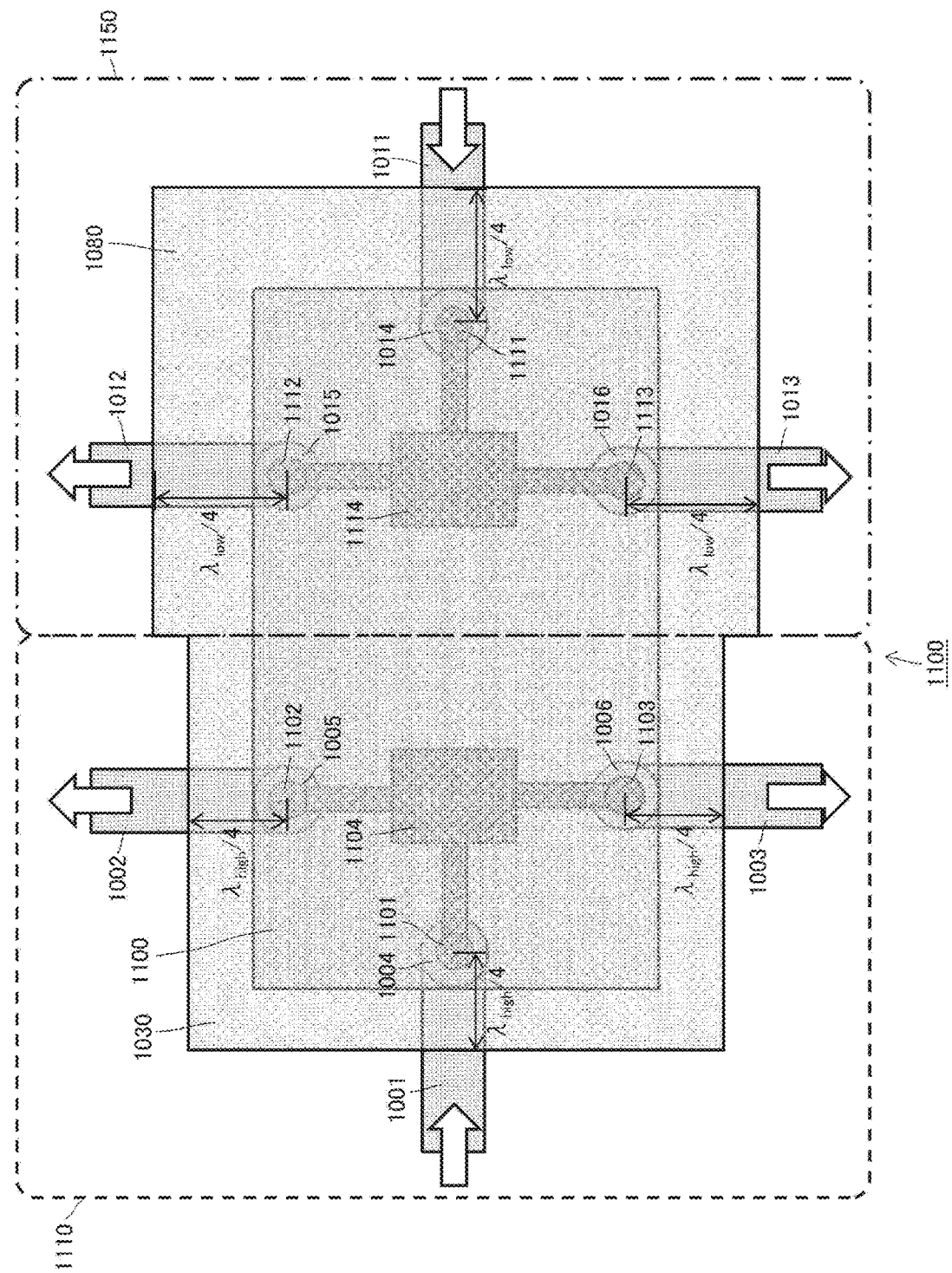
FIG. 10 is a diagram illustrating an exemplary configuration of a printed circuit board 1000 according to another modification.

Also, FIG. 10 illustrates an exemplary configuration of a printed circuit board 1000 according to another modification in which the land diameter and the electrical length of the resist film are optimized.

A circuit chip 1100 is mounted onto the printed circuit board 1000. Also, the circuit chip 1100 is provided with a high-frequency signal propagation unit 1110 that propagates high-frequency signals such as millimeter waves, and a low-frequency signal propagation unit 1150 that propagates low-frequency signals.

The high-frequency signal propagation unit 1110 of the circuit chip 1100 includes one input terminal 1101, two output terminals 1102 and 1103, and an RF switch 1104 that selects one of the output terminals 1102 or 1103 as the output destination of a signal input into the input terminal 1101.

Also, on the surface of the printed circuit board 1100, corresponding to the high-frequency signal propagation unit 1110, an interconnect 1001 for transmitting an input signal to the input terminal 1101, a land 1004 formed on the leading end of the interconnect 1001 to act as an electrical contact with the input terminal 1101, an interconnect 1002 for transmitting a signal output from the output terminal 1102, a land 1005 formed on the leading end of the interconnect 1002 to act as an electrical contact with the output terminal 1102, an interconnect 1003 for transmitting a signal output from the output terminal 1103, and a land 1006 formed on the leading end of the interconnect 1003 to act as an electrical contact with the output terminal 1103 are formed. Each electrical contact between a terminal and an interconnect is bonded by solder, but is omitted from illustration herein.

Meanwhile, the low-frequency signal propagation unit 1150 of the circuit chip 1100 includes one input terminal 1111, two output terminals 1112 and 1113, and an RF switch 1114 that selects one of the output terminals 1112 or 1113 as the output destination of a signal input into the input terminal 1111.

Also, on the surface of the printed circuit board 1100, corresponding to the low-frequency signal propagation unit 1150, an interconnect 1011 for transmitting an input signal to the input terminal 1111, a land 1014 formed on the leading end of the interconnect 1011 to act as an electrical contact with the input terminal 1111, an interconnect 1012 for transmitting a signal output from the output terminal 1112, a land 1015 formed on the leading end of the interconnect 1012 to act as an electrical contact with the output terminal 1112, an interconnect 1013 for transmitting a signal output from the output terminal 1113, and a land 1016 formed on the leading end of the interconnect 1013 to act as an electrical contact with the output terminal 1113 are formed. Each electrical contact between a terminal and an interconnect is bonded by solder, but is omitted from illustration herein.

Furthermore, a predetermined region on the surface of the high-frequency signal propagation unit 1110 of the circuit chip 1100 is covered by a resist film 1030. Similarly, a predetermined region on the surface of the low-frequency signal propagation unit 1150 of the circuit chip 1100 is covered by a resist film 1080. The resist films 1030 and 1080 act to insulate or prevent shorts between the interconnects, and also prevent oxidation of the interconnects and the like. In the present embodiment, the application regions of the resist films 1030 and 1080 also act to impart capacitance immediately before a structural portion where signals are reflected.

The circuit chip 1100 has a low impedance Z1, whereas the interconnects 1001, 1002, and 1003 as well as the interconnects 1011, 1012, and 1013 have a high impedance Z2. On the other hand, by imparting capacitance, the application regions of the resist films 1030 and 1080 can form intermediate sections having an intermediate impedance Z0 (where Z1<Z0<Z2).

The value of the impedance Z0 of the intermediate section is calculated from the low impedance value Z1 and the high impedance value Z2 using Expression (1) above. The impedance of the intermediate sections at the electrical contacts of each of the terminals 1101 to 1103 and the terminals 1111 to 1113 can be adjusted according to the land diameter of each of the lands 1004 to 1106 and the lands 1164 to 1166.

Also, to suppress propagation loss due to reflections of signals transmitted through each of the interconnects 1001 to 1003, it is desirable for the distances from the center of each of the terminals 1101 to 1103 to the edge of the resist film 1030 that act as the intermediate sections to each have an electrical length of $\lambda_{high}/4$ (where $\lambda_{high}$ is the electromagnetic wavelength corresponding to a high-frequency signal propagated in the high-frequency signal propagation unit 1110).

Similarly, to suppress propagation loss due to reflections of signals transmitted through each of the interconnects 1011 to 1013, it is desirable for the distances from the center of each of the terminals 1111 to 1113 to the edge of the resist film 1080 that act as the intermediate sections to each have an electrical length of $\lambda_{low}/4$ (where $\lambda_{low}$ is the electromagnetic wavelength corresponding to a low-frequency signal propagated in the low-frequency signal propagation unit 1150).

The electrical length of the resist film formed at the periphery of the circuit chip is determined by the electromagnetic wavelength corresponding to the frequency of the desired signal to propagate. As illustrated in FIG. 10, in the case of the printed circuit board 1000 on which the circuit chip 1100 that includes two types of RF switches 1104 and 1114 and operates at different frequencies is mounted, because the electromagnetic wavelength of the high-frequency signals is shorter than the low-frequency signals (that is, $\lambda_{high} < \lambda_{low}$) a narrow resist film 1030 is formed on the high-frequency signal propagation unit 1110 while a wide resist film 1080 is formed on the low-frequency signal propagation unit 1150, thereby optimizing the propagation characteristics of each of the RF switches 1104 and 1114.

To summarize the technology disclosed in this specification, by providing intermediate sections having an intermediate impedance and an electrical length corresponding to a desired frequency in portions of mismatched impedance, the reflection characteristics can be improved, and therefore the propagation characteristics of the desired frequency can be improved.

Also, providing the impedance matching structure immediately before the location where the mismatched impedance is occurring leads to a large improvement in the characteristics. According to the technology disclosed in this specification, impedance matching is performed by utilizing lands for mounting a circuit chip onto a printed circuit board, and therefore impedance matching can be achieved effectively with respect to reflections produced due to mismatched impedance between the printed circuit board and the circuit chip.

Also, according to the technology disclosed in this specification, fine adjustment of the impedance matching is possible by adjusting the resist film. Consequently, fine adjustment of the impedance matching can be performed easily even in a later step after the wiring pattern of the printed circuit board has been determined.

Also, according to the technology disclosed in this specification, because impedance matching is achieved by utilizing the structure of the lands on the surface, no constraints are imposed on properties such as the layer structure or the arrangement of through-holes, and the disclosed technology can be applied to a variety of different types of printed circuit boards.

The technology disclosed in this specification can be favorably applied to printed circuit boards used in a variety of different types of information appliances and electronic devices, such as mobile phones, communication equipment for wireless local area networks (LANs) and the like, and digital cameras.

Note that the physical length of a resist film is generally around several hundred microns, and considering that this length is an electrical length of 4/λ corresponding to millimeter-wave signals (where λ is the electromagnetic wavelength corresponding to a desired frequency), the technology disclosed in this specification can be applied more favorably to a transmission apparatus that propagates high-frequency signals rather than low-frequency signals.

INDUSTRIAL APPLICABILITY

The foregoing thus describes the technology disclosed in this specification in detail and with reference to specific embodiments. However, it is obvious that persons skilled in the art may make modifications and substitutions to these embodiments without departing from the spirit of the technology disclosed in this specification.

The technology disclosed in this specification can be applied to a printed circuit board on which a high-frequency circuit for wireless communication using the millimeter-wave band for example is mounted, and suppress propagation loss caused by mismatched impedance.

Essentially, the technology disclosed in this specification has been described by way of example, and the stated content of this specification should not be interpreted as being limiting. The spirit of the technology disclosed in this specification should be determined in consideration of the claims.

Additionally, the technology disclosed in the present specification can also be configured as below.

(1) A transmission apparatus including:
a package having a first impedance;
a first transmission line and a second transmission line respectively connected on either side of the package and having a second impedance different from the first impedance; and
an intermediate section respectively disposed in a connection between the package and the first transmission line and in a connection between the package and the second transmission line, and adjusted to have an electrical length of λ/4 (where λ is an electromagnetic wavelength corresponding to a desired frequency) and an impedance that is intermediate between the first impedance and the second impedance.

(2) The transmission apparatus according to (1), in which
when a signal of the desired frequency is input into the first transmission line, a first reflected wave at a boundary between the first transmission line and the intermediate section and a second reflected wave at a boundary between the intermediate section and the package have opposite phase and substantially a same power so as to cancel each other out, and
when a signal of the desired frequency is input into the second transmission line, a first reflected wave at a boundary between the second transmission line and the intermediate section and a second reflected wave at a boundary between the intermediate section and the package have opposite phase and substantially a same power so as to cancel each other out.

(3) The transmission apparatus according to (1) or (2), in which
the package is a circuit chip,
the first transmission line and the second transmission line are wiring patterns formed on a printed circuit board,
terminals on both ends of the circuit chip are respectively soldered to a land formed at each end of the first transmission line and the second transmission line, and
the intermediate section is a resist film application region that covers the land and an area near the land of the first transmission line and the second transmission line.

(4) The transmission apparatus according to any one of (1) to (3), in which
an impedance Z0 of the intermediate section is adjusted on the basis of a first impedance Z1 of the package and a second impedance Z2 of the first transmission line and the second transmission line.

(5) The transmission apparatus according to (4), in which the impedance Z0 of the intermediate section is adjusted on the basis of Expression (2) below.

[Math. 2]

$$Z0 = \sqrt{Z1 \times Z2} \quad (2)$$

(6) The transmission apparatus according to (3), in which the impedance of the intermediate section is adjusted on the basis of a size of the land.

(7) The transmission apparatus according to (3) or (6), in which
the resist film application region is formed from an electrical contact between a terminal of the circuit chip and the wiring pattern up to a point at which an electrical length of λ/4 is reached.

(8) A printed circuit board having a surface on which a circuit chip having a first impedance is mounted,
the printed circuit board including:
a first wiring pattern and a second wiring pattern respectively connected to an input terminal and an output terminal of the circuit chip and having a second impedance different from the first impedance;
a first land configured to act as a contact between the input terminal of the circuit chip and the first wiring pattern and a second land configured to act as a contact between the output terminal of the circuit chip and the second wiring pattern, the first and second lands each having a third impedance that is intermediate between the first impedance and the second impedance; and
a resist film application region that covers the first land and the second land, and has an electrical length corresponding to a desired frequency.

(9) An information appliance including:
one or a plurality of printed circuit boards,
at least one printed circuit board having a surface on which a circuit chip having a first impedance is mounted;
a first wiring pattern and a second wiring pattern respectively connected to an input terminal and an output terminal of the circuit chip and having a second impedance different from the first impedance;
a first land configured to act as a contact between the input terminal of the circuit chip and the first wiring pattern and a second land configured to act as a contact between the output terminal of the circuit chip and the second wiring pattern, the first and second lands each having a third impedance that is intermediate between the first impedance and the second impedance; and
a resist film application region that covers the first land and the second land, and has an electrical length corresponding to a desired frequency.

REFERENCE SIGNS LIST

100 Printed circuit board
101002 Interconnect
103, 104 Land
110 Circuit chip
110112 Connecting terminal
121, 122 Solder
130 Resist film
131, 132 Intermediate section (resist application region)
1000 Printed circuit board
1001 to 1003 Interconnect (high-frequency signal)
1004 to 1005 Land (high-frequency signal)
1011 to 1013 Interconnect (low-frequency signal)
1014 to 1016 Land (low-frequency signal)
1030 Resist film (high-frequency signal)
1080 Resist film (high-frequency signal)
1100 Circuit chip
1101 Input terminal (high-frequency signal)
1102, 1103 Output terminal (high-frequency signal)
1104 RF switch (high-frequency signal)
1110 High-frequency signal propagation unit 1111 Input terminal (high-frequency signal)
1112, 1113 Output terminal (high-frequency signal)
1114 RF switch (high-frequency signal)
1150 Low-frequency signal propagation unit

The invention claimed is:
1. A transmission apparatus, comprising:
a package having a first impedance;
a first transmission line and a second transmission line respectively connected on either side of the package, wherein
   each of the first transmission line and the second transmission has a second impedance different from the first impedance, and
   terminals on both ends of the package are respectively soldered to a land formed at each end of the first transmission line and the second transmission line; and
an intermediate section in a connection between the package and the first transmission line and in a connection between the package and the second transmission line, wherein
   the intermediate section is adjusted to have an electrical length of $\lambda/4$,
   $\lambda$ is an electromagnetic wavelength corresponding to a desired frequency,
   an impedance of the intermediate section is intermediate between the first impedance and the second impedance, and
   the intermediate section is a resist film application region that covers the land and an area near the land of the first transmission line and the second transmission line.

2. The transmission apparatus according to claim 1, wherein
when a signal of the desired frequency is input into the first transmission line, a first reflected wave at a boundary between the first transmission line and the intermediate section and a second reflected wave at a boundary between the intermediate section and the package have opposite phase and substantially a same power so as to cancel each other out, and
when a signal of the desired frequency is input into the second transmission line, a first reflected wave at a boundary between the second transmission line and the intermediate section and the second reflected wave at the boundary between the intermediate section and the package have opposite phase and substantially a same power so as to cancel each other out.

3. The transmission apparatus according to claim 1, wherein
the package is a circuit chip, and
the first transmission line and the second transmission line are wiring patterns formed on a printed circuit board.

4. The transmission apparatus according to claim 1, wherein
an impedance Z0 of the intermediate section is adjusted based on the first impedance Z1 of the package and the second impedance Z2 of the first transmission line and the second transmission line.

5. The transmission apparatus according to claim 4, wherein
the impedance Z0 of the intermediate section is adjusted based on Expression (1) below:

[Math. 1]
$$Z0 = \sqrt{Z1 \times Z2} \tag{1}$$

6. The transmission apparatus according to claim 1, wherein
the impedance of the intermediate section is adjusted based on size of the land.

7. The transmission apparatus according to claim 3, wherein
an application region of the resist film from an electrical contact between a terminal of the circuit chip and a wiring pattern up to a point at which the electrical length of $\lambda/4$ is reached.

* * * * *